(12) United States Patent
Zhang et al.

(10) Patent No.: US 7,952,425 B2
(45) Date of Patent: May 31, 2011

(54) ADAPTIVE FILTERING SYSTEM FOR PATIENT SIGNAL MONITORING

(75) Inventors: Hongxuan Zhang, Palatine, IL (US); Jeffrey Rebacz, Medinah, IL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 114 days.

(21) Appl. No.: 12/488,837

(22) Filed: Jun. 22, 2009

(65) Prior Publication Data

US 2010/0060350 A1    Mar. 11, 2010

Related U.S. Application Data

(60) Provisional application No. 61/096,137, filed on Sep. 11, 2008.

(51) Int. Cl.
*H03K 5/00* (2006.01)
(52) U.S. Cl. .......... 327/553; 327/552
(58) Field of Classification Search .......... 327/551–559
See application file for complete search history.

(56) References Cited

U.S. PATENT DOCUMENTS

| | | | |
|---|---|---|---|
| 3,967,102 A | 6/1976 | McCown | |
| 4,513,254 A | 4/1985 | Harr | |
| 5,436,564 A * | 7/1995 | Kreger et al. | 600/411 |
| 5,513,649 A * | 5/1996 | Gevins et al. | 600/544 |
| 5,706,013 A * | 1/1998 | Melvin et al. | 342/159 |
| 5,929,699 A | 7/1999 | Lewicki | |
| 6,032,166 A | 2/2000 | Signell | |
| 6,405,227 B1 | 6/2002 | Prakash | |
| 6,487,295 B1 * | 11/2002 | Lofgren et al. | 381/71.12 |
| 6,593,802 B2 | 7/2003 | Mariani | |
| 6,636,128 B2 | 10/2003 | Rauscher | |
| 6,646,498 B2 | 11/2003 | Mohieldin | |
| 6,677,814 B2 | 1/2004 | Low | |
| 6,689,064 B2 * | 2/2004 | Hager et al. | 600/454 |
| 7,024,006 B1 | 4/2006 | Schwartz | |
| 7,212,068 B2 | 5/2007 | Onody | |
| 2006/0062405 A1 | 3/2006 | McKee | |
| 2006/0153404 A1 | 7/2006 | Gardner | |
| 2007/0253577 A1 | 11/2007 | Yen | |

* cited by examiner

*Primary Examiner* — Dinh T. Le
(74) *Attorney, Agent, or Firm* — Alexander J Burke

(57) ABSTRACT

A system provides a high quality, and intuitive multi-band filter that adapts when noise frequencies or noise amplitudes change. A system for adaptively filtering patient monitoring signals, comprises a filter controller for adaptively determining the number of, and individual filter bandwidth of, multiple adaptive signal filters to be used in filtering multiple bandwidths within an encompassing signal filtering bandwidth. The filter controller does this in response to, (a) noise data indicating noise source frequencies and (b) configuration data determining medical signal or noise source characteristics, to provide programming data for programming a plurality of adaptive signal filters. The system includes multiple adaptive signal filters individually having a filtering bandwidth and filtering characteristic programmable in response to received programming data. A noise detector automatically identifies a noise component in a received patient monitoring signal and generates the noise data.

15 Claims, 6 Drawing Sheets

ADAPTIVE FILTERING SYSTEM FOR PATIENT SIGNAL MONITORING

This is a non-provisional application of provisional application Ser. No. 61/096,137 filed Sep. 11, 2008, by H. Zhang et al.

FIELD OF THE INVENTION

This invention concerns a system and user interface for filtering patient monitoring signals by adaptively determining the number and individual filter bandwidth of multiple adaptive signal filters to be used in filtering multiple bandwidths within an encompassing signal filtering bandwidth.

BACKGROUND OF THE INVENTION

Electronic filters and their controls desirably yield high quality signals, especially in medical signal acquisition where signals are in the millivolt level, such as surface electrocardiogram (ECG) and intra-cardiac electrogram (ICEG) signals. Known signal processing systems use an application-specific scheme of filters while sacrificing flexibility and user interface area for high quality signal management. Also, known filters are typically not adaptive (they fail to filter noise if the noise shifts out of a band stop region). Signal acquisition systems need to process a variety of noise sources that are variable in amplitude and frequency in order to provide a clean signal from an input source, such as a patient in the presence of patient movement noise, power line electrical noise and electrical and magnetic noise from other medical instruments in hospitals.

For example, known ECG signal acquisition systems typically use several large and cumbersome low-pass filter, notch filter, and high-pass filter networks implemented with operational amplifiers. Further, known signal acquisition filtering schemes are typically not adaptive and are sensitive to noise if the line frequency shifts from 60 Hz to 60.1 Hz. Further, settings of known filter systems are typically complicated and difficult to optimize. For instance, surround sound users are often unable to optimize parametric equalizers because of interface complexity. In addition, current filter systems in medical devices typically have no sub-frequency band control, such as different sub-frequency bands like 50-60 Hz or 200-250 Hz, in an encompassing signal bandwidth (0-2000 Hz). Efficient and correct manual filter control and adjustment needs extensive experience and knowledge, which increases work complexity for medical users. A system according to invention principles addresses these deficiencies and related problems.

SUMMARY OF THE INVENTION

A system provides an easily adjustable multi-band filter that adapts when noise frequencies or noise amplitudes change to improve the quality and reliability of medical signal acquisition which facilitates accurate and precise diagnosis and treatment, and improves patient safety. A system for adaptively filtering patient monitoring signals comprises a filter controller for adaptively determining the number of and individual filter bandwidth of multiple adaptive signal filters to be used in filtering multiple bandwidths within an encompassing signal filtering bandwidth. The filter controller does this in response to, (a) noise data indicating noise source frequencies and (b) configuration data determining medical signal or noise source characteristics, to provide programming data for programming a plurality of adaptive signal filters. The system includes multiple adaptive signal filters individually having a filtering bandwidth and filtering characteristic programmable by received programming data. A noise detector automatically identifies a noise component in a received patient monitoring signal and generates noise control data to cause filter frequency response to change in response to programmed settings.

DETAILED DESCRIPTION OF THE INVENTION

A system according to invention principles provides improved patient monitoring signal quality using multi-band, controllable, adaptive filtering involving analogue or digital feedback and a Digital Signal processor (DSP) or analogue Field Programmable Gate Array (FPGA), for example. The system advantageously provides improved circuit integration and monitors signal quality with versatile sub-band signal frequency control to increase signal-to-noise ratio. The filtering system further adapts to changing noise and employs a user friendly interface. In one embodiment, the system provides multi-band, controllable, adaptive filtering analogous to a programmable and adaptive parametric equalizer. Signal-to-noise ratio is an important criterion in many applications, especially in medical signal acquisition. Medical filters typically need to eliminate low frequency noise sources below 5 Hz, high frequencies over 200 Hz and some frequency ranges in between such as three harmonics of the line frequency (60 Hz, 120 Hz and 180 Hz). Noise in these ranges may bury a signal, making it difficult to read, measure, and interpret.

Figure 1:
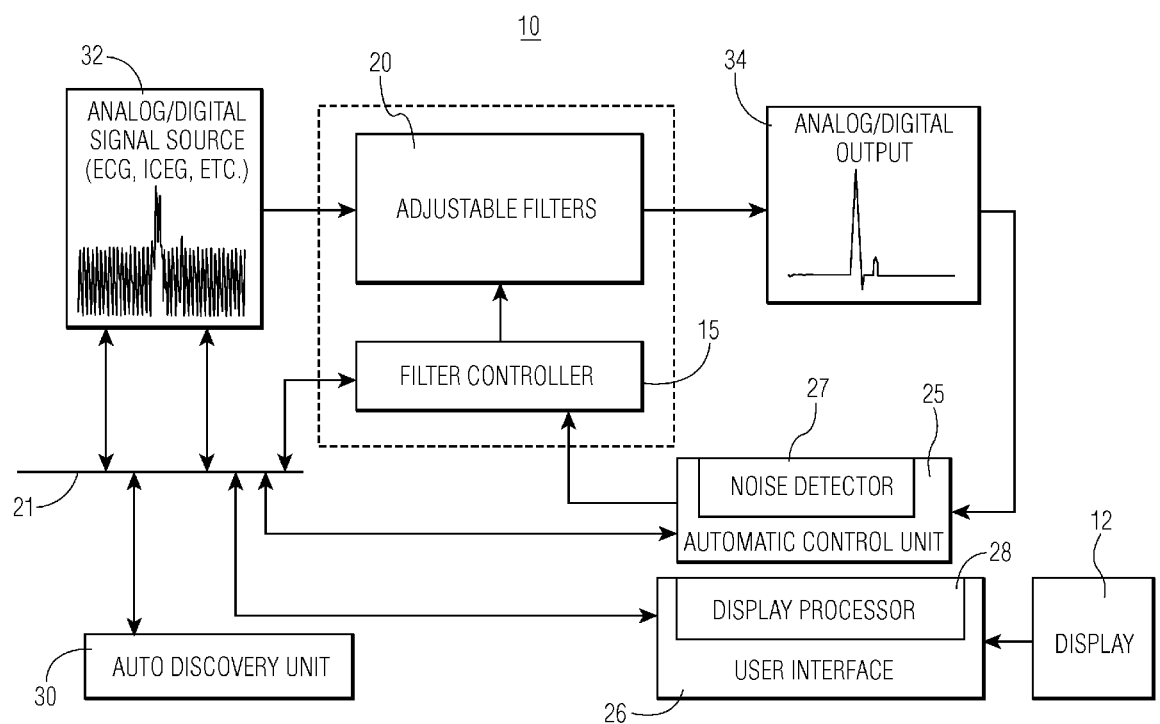
FIG. 1 shows a system for adaptively filtering patient monitoring signals, according to invention principles.

FIG. 1 shows automatic adaptive multi-frequency band control system 10 for adaptively filtering patient monitoring signals containing noise from analog or digital signal source 32. Source 32 may comprise a patient monitoring device providing electrocardiogram (ECG) or intra-cardiac electrocardiogram (ICEG) signals, or other patient monitoring signals. Filter controller 15 adaptively determines the number of and individual filter bandwidth of multiple adaptive signal filters 20 to be used in filtering multiple bandwidths within an encompassing signal filtering bandwidth. Adaptive signal filters individually have a filtering bandwidth and filtering characteristic programmable in response to received programming data. Filter controller 15 does this in response to noise data indicating noise source frequencies and configuration data determining medical signal or noise source characteristics to provide programming data for programming multiple adaptive signal filters. Noise detector 27 automatically identifies a noise component in an output signal 34 provided by filtering a patient monitoring signal from source 32 and generates the noise data. System 10 filters noise and adapts to shifting noise frequencies. For example, if mains frequency drifts to 60.1 Hz, filters 20 filter out line noise (including harmonics) by adapting individual filter center frequencies to substantially filter the noise. In contrast, known systems typically fail to adapt and therefore let noise pass.

Automatic Control unit 25, which may be embodied as a logic device (e.g., a programmable logic device, a field programmable gate array (FPGA) or a microprocessor) receives filter feedback 34 derived from a filters 20 output and sends data to filter controller 15 that adapts filters 20 to changing conditions. Automatic Control unit 25 continually checks to determine if predetermined conditions are met for switching and adjusting filter parameters to adapt filter characteristics (including center frequency and bandwidth). User interface 26 in conjunction with display processor 28 provides a graphical user interface (GUI) and menus on display 12 enabling a user to enter data comprising the configuration data. Alternatively, user interface 26 is used to control system 10. Further, patient monitoring devices such as source 32, in one embodiment inter-communicates with the adaptive filter of system 10 via network 21. Auto-discovery interface 30 automatically interrogates patient monitoring devices on the medical network 21 and provides the data indicating the type of patient monitoring device and patient signals being used in monitoring the patient. Such information is used for adjusting the filter controller 15.

Signal-to-noise ratio is of importance in many applications, especially in medical signal acquisition. Medical filters typically need to eliminate low frequencies below 5 Hz, high frequencies over 200 Hz and some frequency ranges in between, e.g., three harmonics of line frequency (60 Hz, 120 Hz and 180 Hz). These noise frequencies can bury a signal, making it difficult to read, measure, and interpret. System 10 filters the noise in the signal from source 32 and adapts to shifting noise frequencies. For example, if mains frequency drifts to 60.1 Hz, filters 20 filter out mains noise and its harmonics by adapting individual filter center frequencies to substantially filter out the noise. Automatic Control unit 25 automatically adapts filters 20 via controller 15. Alternatively, a user is able to manually adjust filters 20 using a software-implemented interface. In one embodiment, filter controller 15 includes various writable registers, analogue or digital, that modify the characteristics of adaptive filters 20. Automatic control unit 25 controls the registers to adjust the overall filter characteristic by adjusting individual filters of filters 20 to filter a noisy sub-band frequency. Adaptive multi-frequency band control and adjustment system 10 is implemented in electronic hardware and software.

Figure 2:
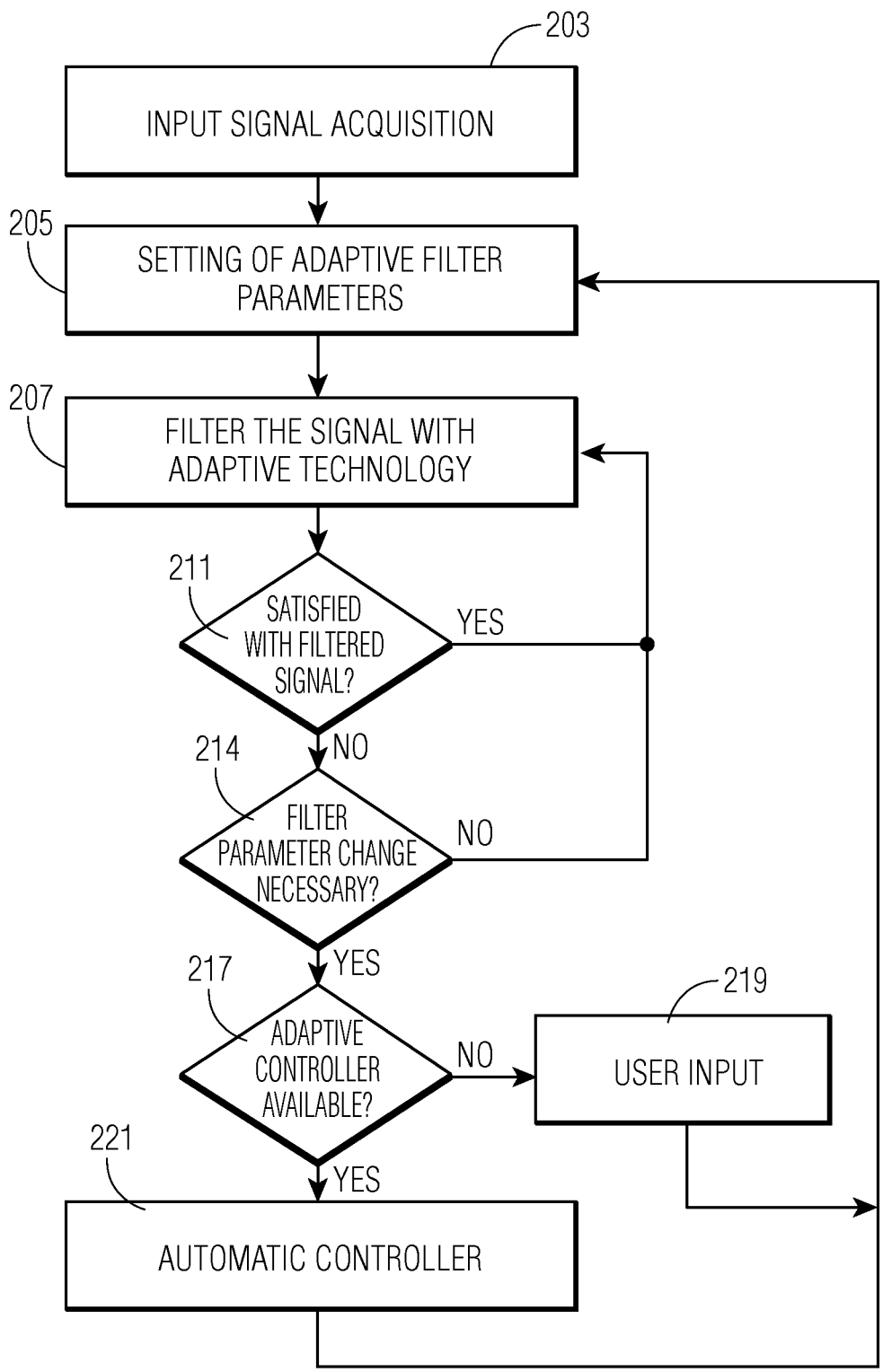
FIG. 2 shows a flowchart of a process used by a system for adaptively filtering patient monitoring signals to improve signal quality, according to invention principles

FIG. 2 shows a flowchart of a process used by system 10 for adaptively filtering patient monitoring signals to improve signal quality. In an automatically adaptive mode, automatic control unit 25 (FIG. 1) automatically detects unsatisfactory filtering and adjusts filters 20 using filter controller 15. Similarly, in a manual mode, a user manually adjusts filtering parameters via user interface 26 and display 12. In step 203, filters 20 receive a patient monitoring input signal from source 32 and adaptively filter the input signal in step 207 with filtering characteristics set in step 205. The characteristics adaptively determine whether individual filters of multi-band adaptive filters 20 are low pass, high pass or bandpass as well as filter bandwidth and center frequency of the individual filters, for example. Automatic control unit 25 in step 211 determines whether the input signal is adequately filtered in response to noise detected by noise detector 27. If it is determined in step 211 that the input signal is adequately filtered, filters 20 continue filtering the signal in step 207. If it is determined in step 211 that the input signal is inadequately filtered, automatic control unit 25 in step 214 determines whether filter characteristics are to be changed. In response to determining the filter characteristics are not to be changed, filters 20 continue filtering the signal in step 207. In response to determining the filter characteristics need to be changed, automatic control unit 25 (if available as determined in step 217) adjusts filters 20 using filter controller 15 in step 221 by setting filtering characteristics in step 205. If it is determined in step 217 that automatic control unit 25 is unavailable, filtering characteristics are set in step 205 in response to user data entry via user interface 26 and display 12 in step 219.

Figure 3:
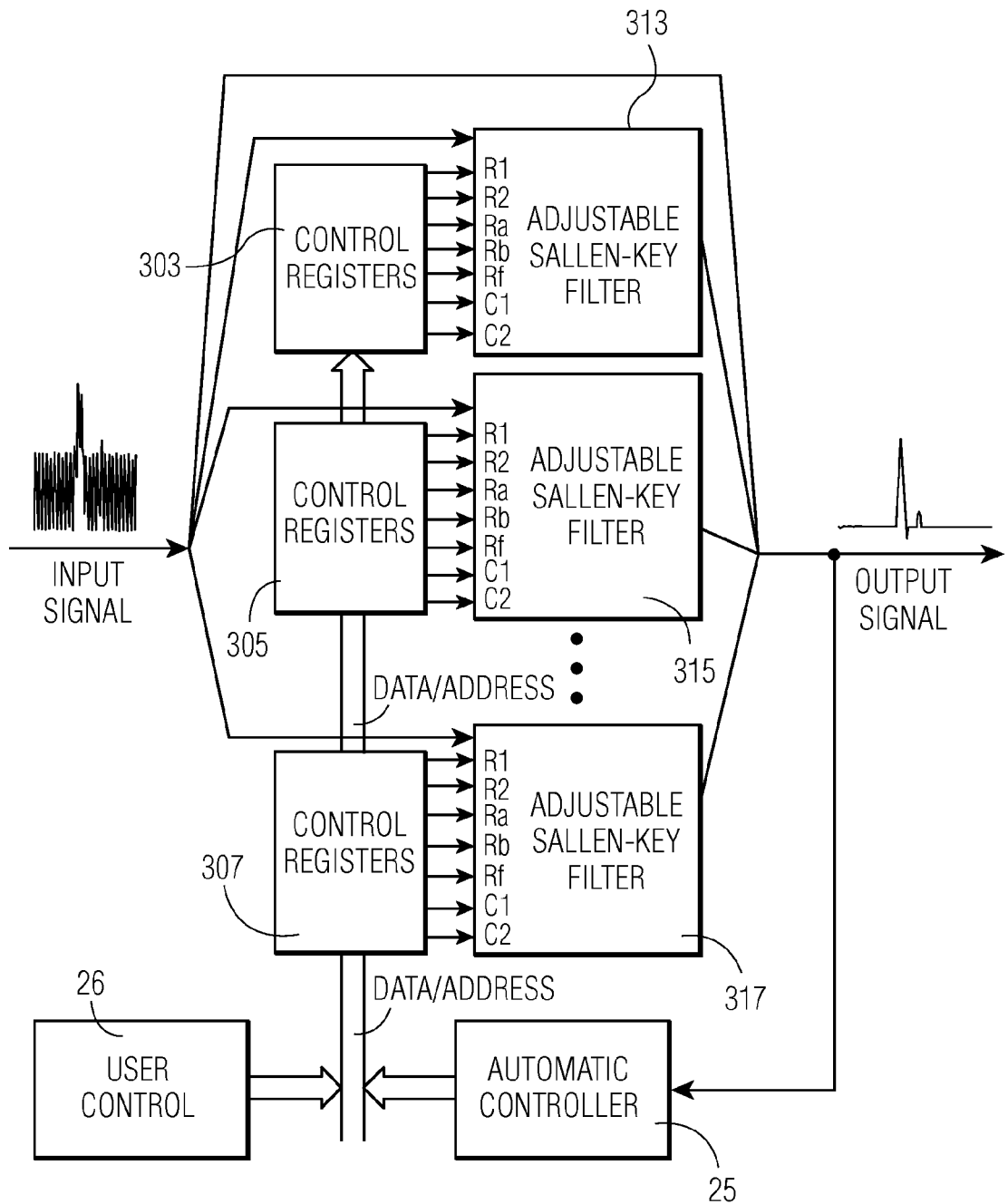
FIG. 3 shows an adaptive filter controller, according to invention principles.

FIG. 3 shows architecture of an adaptive filter controller. A user via user interface 26 manually adjusts control registers 303. 305 and 307. Alternatively, automatic control unit 25 (FIG. 1) adaptively automatically individually adjust control registers 303, 305 and 307. The control registers determine characteristics of corresponding adjustable Sallen-Key filters 313, 315 and 317 that filter an input signal from source 32 (FIG. 1), for example. Adjustable Sallen-Key filters 313, 315 and 317 operate in parallel. In one embodiment of system 10 (FIG. 1), filter unit 20 combines outputs of individual adjustable Sallen-Key filters 313, 315 and 317 with the original input signal from source 32. The signals may be combined in different ways such as by weighted combination or by using digital filters and time delay between combined signals as known, for example. In response to automatic signal feedback or in response to user manual data entry, automatic control unit 25 directs filter controller 15 to configure filters 20 to filter different bands of an input patient monitoring signal.

Figure 4:
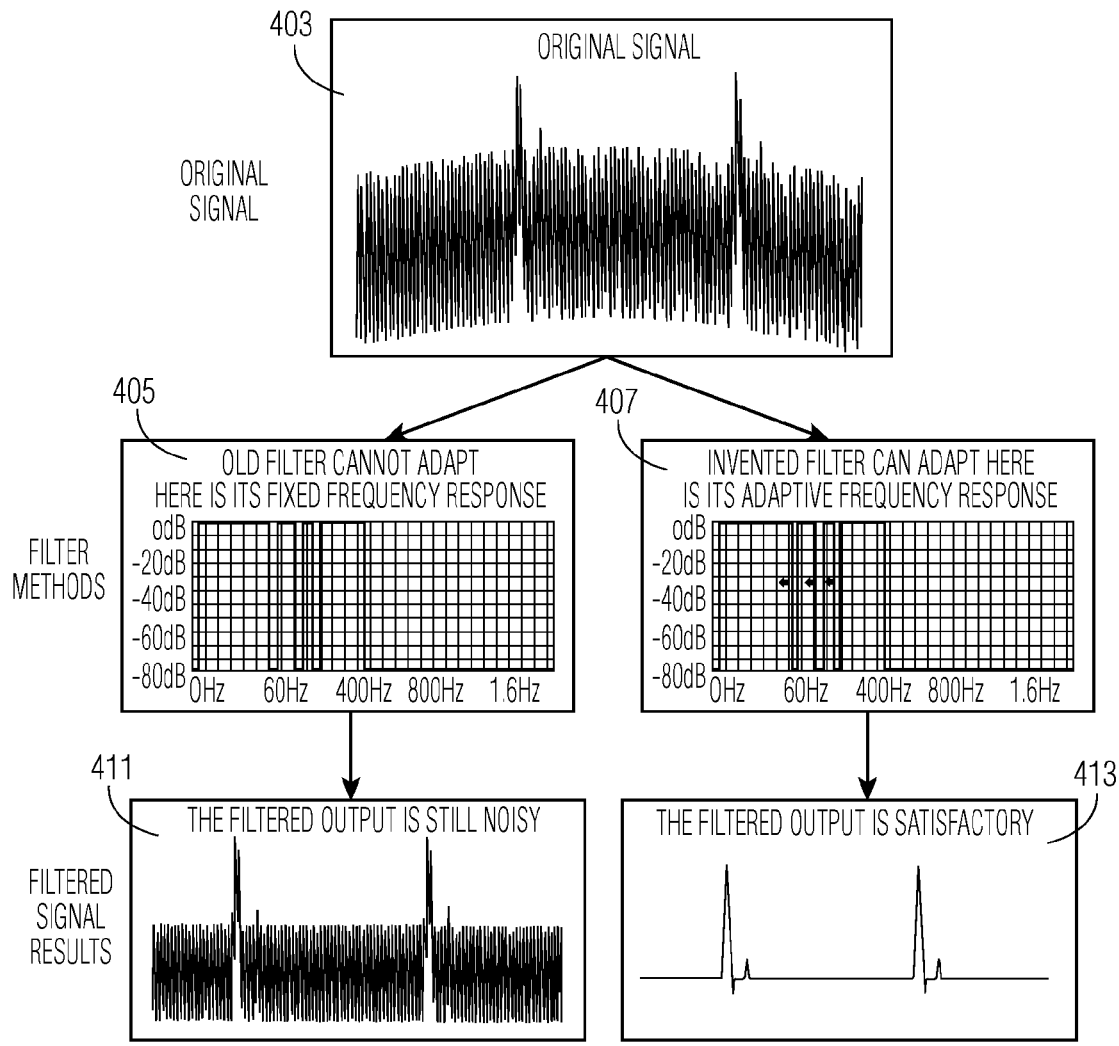
FIG. 4 illustrates signal filtering, according to invention principles.

FIG. 4 illustrates system 10 signal filtering. In operation, filters 20 (FIG. 1) receive a patient ECG waveform 403 buried in noise. Low frequency noise from muscle artifacts, high frequency noise from the environment, and line noise bury the ECG signal. If the frequencies of these noise sources do not change, signal filtering is relatively straightforward. However, filters that make this assumption often perform poorly in real-world circumstances. ECG waveform 403 is filtered by function 405 to provide filtered signal 411 that assumes the mains frequency does not shift. In contrast ECG waveform 403 is filtered by a corresponding adaptive filter function 407 (e.g., filters 20 FIG. 1) to provide filtered signal 413 according to invention principles. Adaptive filter function 407 adaptively accommodates a mains frequency shift to 59.8 Hz, for example. Filter function 405 (a known signal filter function, such as provided by fixed low and high frequency pass filters) is limited to filter between 59.9 Hz and 60.1 Hz (with similar ranges for the harmonics) and performs poorly. In contrast system 10 (FIG. 1) detects the mains frequency shift and adapts filter function 407 in response to the detected mains frequency shift providing a better filtered signal 413.

Under normal conditions, known non-adaptive filter function 405 outputs high quality signals. However, this performance breaks down when abnormal conditions occur. For example, a filter function 405 may be able to widen its band-stop region (and filter between 59.7 and 60.3 Hz instead of 59.9 and 60.1 Hz), to improve signal filtering but fails to filter signals outside this limited widened range. In contrast, adaptive filter function 407 substantially filters noise to optimize signal quality.

Figure 5:
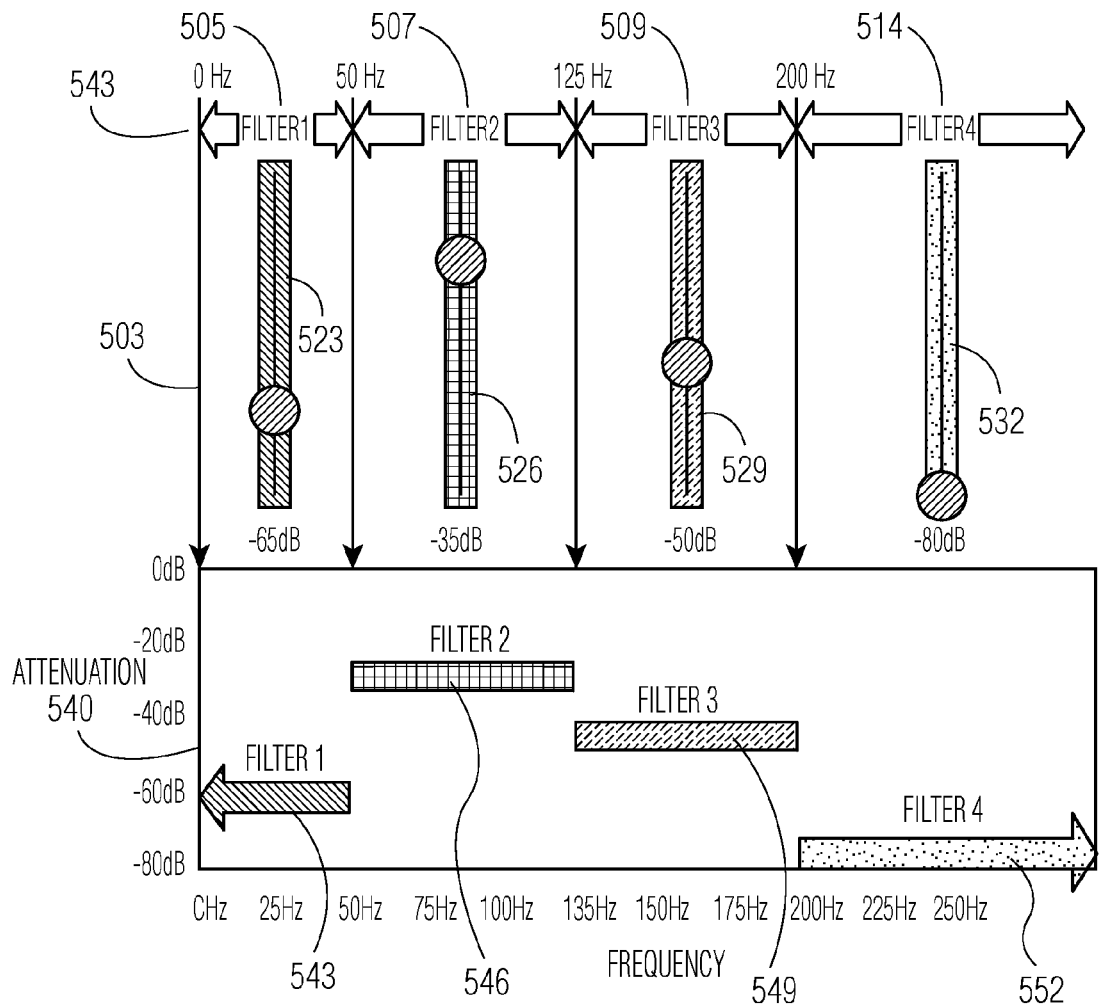
FIG. 5 shows a user interface for multi-frequency band control and adjustment, according to invention principles.

FIG. 5 shows user interface 503 for multi-frequency band control and adjustment. User interface 503 advantageously incorporates a graphic equalizer type display to provide a user friendly interface to adjust the bandwidth and center frequency of individual filters comprising multi-band filters 20 (FIG. 1). User interface 503 enables multi-frequency band control and adjustment of filters 505, 507, 509 and 514, for example. Bandwidths of individual filters 505, 507, 509 and 514 are individually selected by a user by selection of arrows in row 543 to adjust upper and lower cut-off frequencies of the individual filters. Graph 540 shows individual bandwidths filtered by filters 505, 507, 509 and 514. Slider controls 523, 526, 529 and 532 enable a user to adjust individual filter attenuation characteristics. Bar 543 indicates filter 505 attenuates signal frequencies below 50 Hz by 65 dB. Bar 546 indicates filter 507 attenuates signal frequencies between 50 Hz and 125 Hz by 35 dB. Bar 549 indicates filter 509 attenuates signal frequencies between 125 Hz and 200 Hz by 50 dB. Bar 552 indicates filter 514 attenuates signal frequencies above 200 Hz by 80 dB, for example. The bars are indicators that advantageously and intuitively show filter frequency characteristics and bandwidths of multi-band filters adjusted in response to user adjustment. Filter frequency ranges and characteristics indicated in graph 540 are identified and adjusted in response to filter slider control variation. User interface 503 including graphs 540, simplifies the operation of the system without sacrificing its power. A filtering system of similar power but lacking in user friendliness is a parametric equalizer, which requires a user to select filter type, q factor, attenuation level, and center frequency.

System 10 advantageously and concurrently adjusts, controls and manipulates multiple frequency bands in response to detected signal quality characteristics or noise information or in response to user data entry (based on medical signal application knowledge, for example). System 10 detects and analyzes signal noise by determining optimum signal frequency bands, signal power bands, and other characteristics. Automatic control unit 25 provides dynamic frequency band control and adjustment so that individual band filter components are dynamically, concurrently and automatically tuned based on the signal-to-noise ratio and other noise related characteristics such as signal noise frequency, amplitude and phase derived from filter feedback 34 provided from a filters 20 output.

System 10 is adaptively configured in response to clinical application by unit 25 which in one embodiment advantageously and adaptively configures filters 20 based on internally stored data associating filter configuration with clinical application. Clinical applications include Hemodynamic study, Electrophysiological study and Electroencephalogram (EEG) monitoring applications, for example. This is because noise, signal components and bandwidth are different for the different clinical applications. In one embodiment, in response to a predetermined filter configuration indicator, unit 25 in conjunction with filter controller 15, creates N frequency bands and corresponding filters (using software, FPGA firmware and/or hardware) and an output signal is provided in response to the combination of the signal components from the N frequency band filters. System 10 thereby generates a clean and stable signal. Noise detector 27 detects a new noise source, such as resulting from an electro-cautery instrument or electrical signal stimulation which is in a patient monitoring source 32 signal range and inside the encompassing signal filtering bandwidth. An ECG signal comprises signal interference for an ECG recording, for example. Noise detector 27 automatically detects and analyzes noise from the new noise source to quantify and characterize a new noise frequency component and to identify a noise source bandwidth and power range. In response to detection of a new noise component by unit 27, automatic control unit 25 configures filters 20 via filter controller 15.

Automatic control unit 25 automatically initiates configuration of system 10 in response to power-on, user change of processing settings, or detection of change in input signal parameters. Automatic control unit 25 configures system 10 by configuring individual filter characteristics of filters 20 including, filter type, bandwidth, center frequency and attenuation profile. The configuration process may involve limited changes of existing filter bands. The number of frequency bands to be filtered changes to N+n, where N is the number of frequency bands filtered by an existing configuration and n is the number of new signal components to be filtered. The number of frequency bands and the frequency band parameters of filters 20 are adaptively adjusted, tuned, and controlled by units 25 and 15 in real-time in response to analysis and characterization by unit 25 of filtered signal output 34. Further, since individual frequency bands in adaptive multi-band filters 20 are independent, system 10 is adaptively configurable to have overlapping or non-overlapping filter frequency bands of different filters and to adaptively select a transition between two frequency bands. This reduces transition problems of known filter systems resulting from edge effects involving nonlinear filtering effects for a signal in the same band.

System 10 automatically adapts filter characteristics (bandwidth, center frequency, amplification range) in response to medical device configuration data and detected noise source characteristics. The adaptive multi-band filter of system 10 has a multi-band combination with individual filters having individual adjustable frequency bands that are automatically adjusted in response to detected noise characteristics and medical device configuration data (e.g., indicating an ECG or ICEG signal is being filtered). An individual controllable frequency band may be implemented in an analogue or digital (including software) configuration. Adaptive multi-band filters 20 have characteristics controlled by units 25 and 15. The adaptively controlled characteristics include amplitude, bandwidth range, filter order and filter type and other parameters. The system also advantageously optimizes multiple parameters of adaptive multi-band filters 20 in response to noise energy or minimized noise energy, for example.

Figure 6:
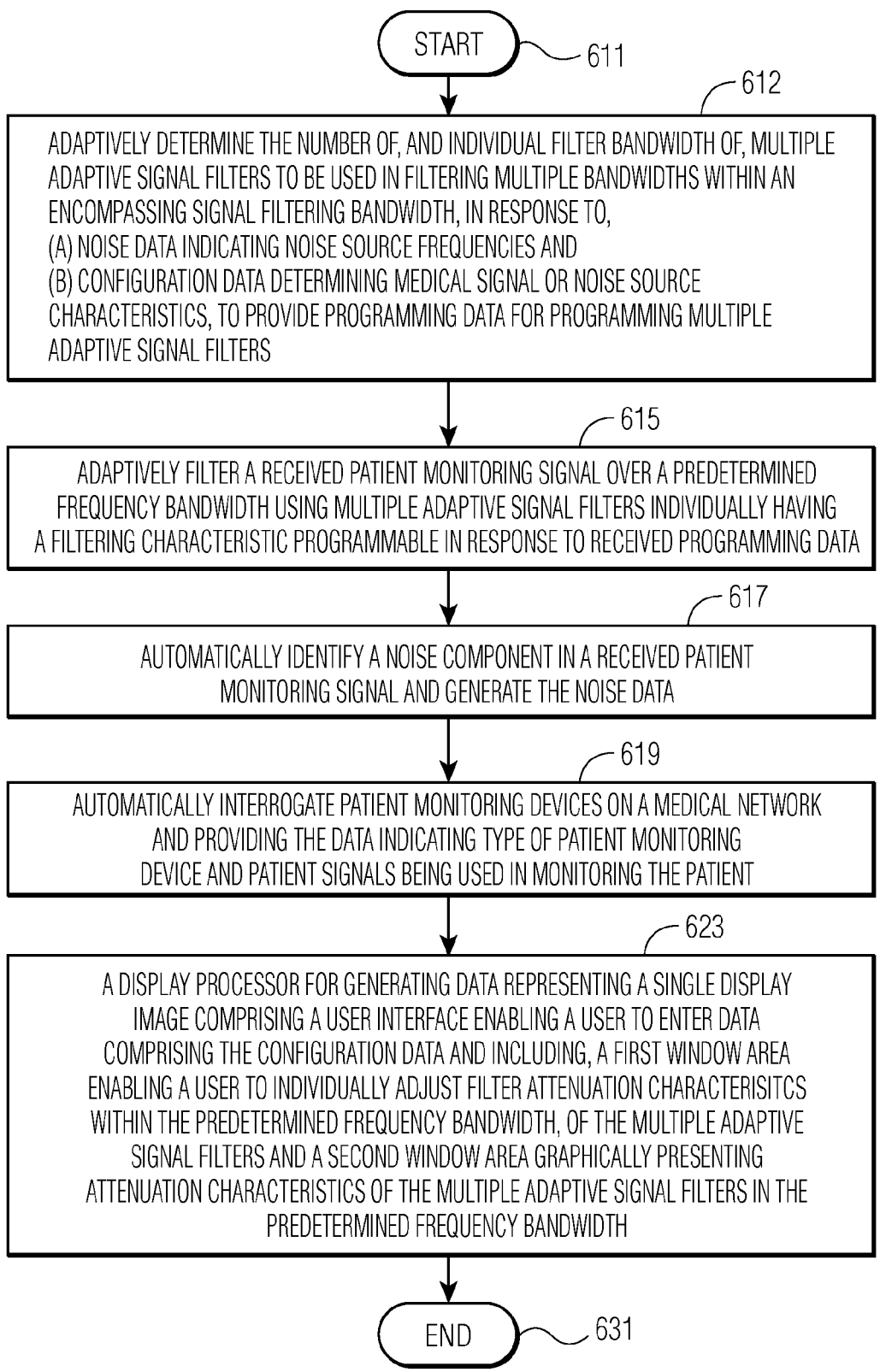
FIG. 6 shows a flowchart of a process used by a system for adaptively filtering patient monitoring signals, according to invention principles.

FIG. 6 shows a flowchart of a process used by system 10 (FIG. 1) for adaptively filtering patient monitoring signals. In step 612 following the start at step 611, automatic control unit 25 together with filter controller 15, adaptively determines the number of and individual filter bandwidth of multiple adaptive signal filters 20 to be used in filtering multiple bandwidths within an encompassing signal filtering bandwidth in response to, (a) noise data indicating noise source frequencies and (b) configuration data determining medical signal or noise source characteristics, to provide programming data for programming multiple adaptive signal filters 20. Multiple adaptive signal filters 20 are at least one of, (a) digital and (b) analog, filters. The configuration data is derived from data indicating the type of patient monitoring device and patient signals being used in monitoring the patient. In one embodiment, user interface 26 enables a user to enter data comprising the configuration data. In step 615, filters 20 adaptively filters received patient monitoring signal from source 32 using multiple adaptive filters individually having a filtering bandwidth and filtering characteristic programmable in response to received programming data for filtering one or more medical signals over a predetermined frequency bandwidth. The programmable filtering characteristic of an individual filter of multiple adaptive signal filters 20 determine whether the filter is at least one of, a low pass filter, a high pass filter and a bandpass filter.

In step 617 noise detector 27 automatically identifies a noise component in the received patient monitoring signal and generates the noise data. Noise detector 27 generates the noise data in response to characteristics of the noise component. The characteristics of the noise component comprise amplitude, frequency and an energy representative indicator of the noise component. Noise detector 27 automatically identifies the amplitude and frequency of the noise component and automatically calculates the energy representative indicator of the noise component. Auto-discovery interface 30 in step 619 automatically interrogates patient monitoring devices on medical network 21 and provides the data indicating the type of patient monitoring device and patient signals being used in monitoring the patient. In step 623 display processor 28 generates data representing a single display image including, a first window area enabling a user to view and individually adjust filter attenuation characteristics within the predetermined frequency bandwidth of multiple adaptive signal filters 20 and a second window area graphically presenting attenuation characteristics of multiple adaptive signal filters 20 in the predetermined frequency bandwidth. The process of FIG. 6 terminates at step 631.

A processor as used herein is a device for executing machine-readable instructions stored on a computer readable medium, for performing tasks and may comprise any one or combination of hardware and firmware. A processor also comprises memory storing machine-readable instructions executable for performing tasks. A processor acts upon information by manipulating, analyzing, modifying, converting or transmitting information for use by an executable procedure or an information device and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system, or other information processing system (e.g., in response to user command or input). An executable procedure is a segment of code or machine-readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a user interface processor and enabling user interaction with a processor or other device and associated data acquisition and processing functions.

The UI also includes an executable procedure or executable application. The executable procedure or executable application conditions the user interface processor to generate signals representing the UI display images. These signals are supplied to a display device which displays the image for viewing by the user. The executable procedure or executable application further receives signals from user input devices, such as a keyboard, mouse, light pen, touch screen, or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 1-6 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The filtering system adapts to changing noise and employs a user friendly interface to provide multi-band, controllable, adaptive filtering. Further, the processes and applications may, in alternative embodiments, be located on one or more (e.g., distributed) processing devices on the network of FIG. 1. Any of the functions and steps provided in FIGS. 1-6 may be implemented in hardware, software or a combination of both.

What is claimed is:

1. A system for adaptively filtering patient monitoring signals, comprising:
    a plurality of adaptive signal filters individually having a filtering bandwidth and filtering characteristics including at least one of, (a) cut-off frequency, (b) center frequency and (c) bandwidth programmable in response to received programming data, said plurality of adaptive signal filters being used to filter a received patient monitoring signal to provide a filtered signal;
    a noise detector for automatically identifying noise components in said received patient monitoring signal and generating noise data indicating different noise source frequencies are present in said received patient monitoring signal; and
    a filter controller, electrically coupled to said noise detector and said plurality of adaptive signal filters for providing said programming data adaptively determining said filtering characteristics and determining the number of, and individual filter bandwidth of, said plurality of adaptive signal filters to be used in filtering a plurality of bandwidths within an encompassing signal filtering bandwidth of said received patient monitoring signal to filter noise at said noise source frequencies, in response to,
        (a) said noise data indicating said noise source frequencies and
        (b) configuration data determining patient monitoring signal or noise source characteristics.

2. A system according to claim 1, wherein
    said individual filter bandwidth of, said plurality of adaptive signal filters encompass corresponding individual noise source frequencies and
    said plurality of adaptive signal filters are at least one of, (a) digital and (b) analog, filters.

3. A system according to claim 1, wherein
    said configuration data is derived from data indicating a type of a particular patient monitoring device processing said received patient monitoring signal and indicating a type of said received patient monitoring signal.

4. A system according to claim 3, including
a user interface electrically coupled to said filter controller, enabling a user to enter data comprising said configuration data.

5. A system according to claim 3, including
an auto-discovery interface electrically coupled to said filter controller, for automatically interrogating patient monitoring devices, including said particular patient monitoring device, on a medical network and providing said data indicating the said type of said particular patient monitoring device and type of patient signals being used in monitoring a patient.

6. A system according to claim 1, wherein
the programmable filtering characteristics including (a) cut-off frequencies, (b) center frequency and (c) bandwidth of an individual filter of said plurality of adaptive signal filters determine whether the filter is at least one of, (a) a low pass filter, (b) a high pass filter and (c) a bandpass filter.

7. A system according to claim 1, wherein
said noise detector generates said noise data in response to characteristics of said noise component.

8. A system according to claim 7, wherein
said characteristics of said noise component comprise amplitude and frequency of said noise component and
said noise detector automatically identifies said amplitude and frequency of said noise component.

9. A system according to claim 7, wherein
said characteristics of said noise component comprise a signal to noise ratio and
said noise detector automatically calculates said signal to noise ratio.

10. A system according to claim 1, wherein
said plurality of adaptive signal filters filter one or more medical signals over a predetermined frequency bandwidth and including
a display processor electrically coupled to said filter controller, for generating data representing a single display image including,
    a first window area enabling a user to individually adjust filter attenuation characteristics within said predetermined frequency bandwidth, of said plurality of adaptive signal filters and
    a second window area graphically presenting attenuation characteristics of said plurality of adaptive signal filters in said predetermined frequency bandwidth.

11. A system according to claim 10, wherein
said first window area enables a user to individually view filter attenuation characteristics within said predetermined frequency bandwidth, of said plurality of adaptive signal filters.

12. A method of adaptive medical signal filtering, comprising the activities of:
adaptively filtering a received patient monitoring signal using a plurality of adaptive filters individually having a filtering bandwidth and filtering characteristics including at least one of, (a) cut-off frequency, (b) center frequency and (c) bandwidth programmable in response to received programming data for filtering one or more received patient monitoring signals over a predetermined frequency bandwidth to provide at least one filtered signal;
automatically identifying noise components in a received patient monitoring signal and generating noise data indicating different noise source frequencies are present in said received patient monitoring signal; and
providing said programming data adaptively determining said filtering characteristics and determining the number of, and individual filter bandwidth of, said plurality of adaptive signal filters to be used in filtering a plurality of bandwidths within an encompassing signal filtering bandwidth of said received patient monitoring signal to filter noise at said noise source frequencies, in response to,
    (a) said noise data indicating said noise source frequencies and
    (b) configuration data determining patient monitoring signal or noise source characteristics.

13. A method according to claim 12, including the activities of
generating data representing a single display image including,
    a first window area enabling a user to individually adjust filter attenuation characteristics within said predetermined frequency bandwidth, of said plurality of adaptive filters,
    a second window area graphically presenting attenuation characteristics of said plurality of adaptive filters in said predetermined frequency bandwidth.

14. A method according to claim 13, wherein
said first window area includes a plurality of adjustable slider representative image elements enabling a user to individually adjust said filter attenuation characteristics.

15. A system according to claim 13, wherein
said first window area enables a user to individually view filter attenuation characteristics within said predetermined frequency bandwidth, of said plurality of adaptive signal filters.

* * * * *